United States Patent [19]
Crafts

[11] Patent Number: 5,610,429
[45] Date of Patent: *Mar. 11, 1997

[54] DIFFERENTIAL ANALOG TRANSISTORS CONSTRUCTED FROM DIGITAL TRANSISTORS

[75] Inventor: Harold S. Crafts, Colorado Springs, Colo.

[73] Assignees: AT&T Global Information Solutions Company, Dayton, Ohio; Hyundai Electronics America, San Jose, Calif.; Symbios Logic Inc., Fort Collins, Colo.

[*] Notice: The term of this patent shall not extend beyond the expiration date of Pat. No. 5,488,294.

[21] Appl. No.: 517,641

[22] Filed: Aug. 22, 1995

Related U.S. Application Data

[63] Continuation of Ser. No. 239,166, May 6, 1994, Pat. No. 5,488,249.

[51] Int. Cl.[6] .................. H01L 27/105; H01L 27/085
[52] U.S. Cl. ................ 257/401; 257/288; 257/390; 257/919
[58] Field of Search ................. 257/919, 288, 257/390, 401; 327/266, 274, 280, 287; 330/253

[56] References Cited

U.S. PATENT DOCUMENTS

| | | | |
|---|---|---|---|
| 3,477,031 | 11/1969 | Nagata | 330/30 |
| 4,229,705 | 10/1980 | Takahashi et al. | 330/258 |
| 4,716,380 | 12/1987 | Proebsting | 330/253 |
| 4,720,685 | 1/1988 | Garuts | 330/253 |
| 4,737,471 | 4/1988 | Shirato et al. | 257/402 |
| 4,851,892 | 7/1989 | Anderson et al. | 357/45 |
| 4,871,978 | 10/1989 | Galbraith | 330/253 |
| 4,884,115 | 11/1989 | Michel et al. | 357/42 |
| 4,884,118 | 11/1989 | Hui et al. | 357/45 |
| 4,907,201 | 3/1990 | Minami et al. | 365/207 |
| 4,963,501 | 10/1990 | Ryan et al. | 257/402 |
| 4,966,859 | 10/1990 | Risch et al. | 437/29 |
| 5,015,890 | 5/1991 | Murakami et al. | 307/530 |
| 5,210,236 | 5/1993 | Takayanagi | 330/253 |
| 5,257,095 | 10/1993 | Liu et al. | 257/315 |
| 5,321,370 | 6/1994 | Yukawa | 330/253 |

FOREIGN PATENT DOCUMENTS

| | | |
|---|---|---|
| 176129 | 10/1973 | France . |
| 000953 | 1/1984 | Japan . |
| 1421924 | 1/1976 | United Kingdom . |

*Primary Examiner*—Sara W. Crane
*Assistant Examiner*—David B. Hardy
*Attorney, Agent, or Firm*—Wayne P. Bailey

[57] ABSTRACT

The invention concerns approaches to interconnecting individual field-effect transistors (FETs) in integrated circuits (ICs), in order to provide a larger, composite transistor. In one approach, the individual FETs are positioned symmetrically about centroids, which are themselves distributed symmetrically over the IC. The invention allows individual digital transistors to be connected into a larger, composite, analog transistor.

6 Claims, 15 Drawing Sheets

IN ALL FOUR CASES

DASHED TOTAL = 60
SOLID TOTAL = 60

EQUIVALENT ANALOG TRANSISTOR

EQUIVALENT ANALOG TRANSISTOR

DIFFERENTIAL ANALOG TRANSISTORS CONSTRUCTED FROM DIGITAL TRANSISTORS

This is a Continuation of application Ser. No. 08/239, 166, filed May 6, 1994, now U.S. Pat. No. 5,488,249.

The invention concerns the construction of analog-type transistors from individual digital-type transistors.

BACKGROUND OF THE INVENTION

MOSFETs (Metal Oxide Semiconductor Field-Effect Transistors), can be classified into two types, namely, "analog" and "digital." The two types perform different functions. The digital type acts as a switch: it is either ON or OFF. The analog type acts as an amplifier: it amplifies a signal.

These two types are constructed differently: Analog transistors should have long channels with large surface area. Digital transistors should have channels as short as possible. However, since a short channel produces a large electric field along the channel's length (ie, between the source and the drain), the channel should be sufficiently long that the electric field does not exceed the breakdown value of the channel material. These differences will be explained in more detail.

Digital Transistors

The digital type is used as a switch by applying the proper voltage to the gate of the device, thereby causing a change in resistance of the channel material, thereby either (a) blocking current in the channel (with a high resistance), or (b) allowing it to flow (with a low resistance).

This alternation between high (OFF) and low (ON) resistance presents a design problem. On the one hand, the low-resistance state requires a short channel (ie, the distance between the drain and the source), because resistance= (length×resistivity)/cross-sectional area (1) as those terms are defined in FIG. 1. As equation (1) shows, the longer the channel, the higher the resistance.

On the other hand, the high-resistance state requires that the electric field extending between the source and drain remain below the critical value for the channel material.

For example, as in FIG. 2, assume (A) the voltage between the source and drain is five volts, and (B) the source-drain distance L is 1 µM (one micro-meter). Consequently, the electric field is 5 volts per $10^{-6}$ meter, or $5 \times 10^6$ volts per meter. This is a large electric field (in terms of volts per meter), even though the absolute voltage difference between the source and drain is small (ie, five volts).

The electric field must not be allowed to exceed the critical, breakdown voltage of the material.

Therefore, in a digital transistor, the channel is made as short as possible (for low ON resistance), subject to the requirement that the channel must be long enough to prevent the electric field in the OFF state from exceeding the critical value.

Analog Transistors

Analog MOSFETs require different channels: their channels should be long and wide. The channel must be long, in order to obtain high gain. [See, for example, S. M. Sze, *Physics of Semiconductor Devices*, (1969, John Wiley, ISBN 471 84290 7) chapter 7, section 3, p. 340 et seq].

The channel must be wide, in order to reduce a particular type of electrical noise, namely, "1/f noise." This type of noise is so-called because it has been experimentally found to be nearly inversely proportional to frequency, as the designation "1/f" indicates. Because of the inverse proportionality, much of the noise power is concentrated at low frequencies. If gain at low frequencies is important, then the "1/f noise" presents a problem.

It is theorized that this noise is caused by surface traps in the semiconductor material. The traps randomly absorb energy and then re-emit the energy as noise. One solution to the noise problem is to increase the surface area of the channel, which increases the population of surface traps. This solution reduces the "1/f noise" because, by increasing the number of traps, the number of traps available for absorption is increased, as well as the number available for emission. Restated, in a large population of traps, there is a greater likelihood of finding an available trap to absorb radiated noise.

Consequently, in an analog transistor, to reduce noise, the surface area of the channel is made large. To increase gain, the length of the channel is made long.

Conflict Between Analog and Digital Devices

Therefore, an inherent conflict between digital and analog transistors becomes apparent: Analog transistors should have long channels with large surface area. Digital transistors should have channels as short as possible (subject to the limit at which breakdown occurs.)

Exemplary Transistor Dimensions

Channel dimensions L (length) and W (width) are defined in FIG. 1. In a common digital transistor, the channel length lies between 0.7 and 1.5 microns (a micron equals $10^{-6}$ meter), and the channel width lies between 10 and 50 microns. In contrast, for an analog transistor, the channel length commonly lies between 16 and 25 microns, and the channel width commonly lies between 40 to 400 microns. Thus, based on these examples, in an analog transistor, the channel length is about 10 to 35 times longer, and the channel width ranges from equal to about 40 times wider, than the comparable dimensions in a digital transistor.

OBJECTS OF THE INVENTION

It is an object of the invention to provide a combination of digital transistors which behave like a single analog transistor.

SUMMARY OF THE INVENTION

The invention interconnects the sources and drains of several digital transistors, thereby effectively combining the several channels into a single large channel which can be used as an analog transistor.

DETAILED DESCRIPTION OF THE INVENTION

This description will explain (1) the use of an FET as an amplifier, (2) the use of two FETs as a differential amplifier, and (3) the construction of analog FETs from digital FETs according to the invention, and the configuration of the analog FETs as a differential amplifier.

Then, this discussion will explain important features of the invention, some of which result from the construction of point (3), above.

(1) Simple FET amplifier

A simplified FET amplifier is shown in FIGS. 3. The operation can be understood as follows.

Figure 1:
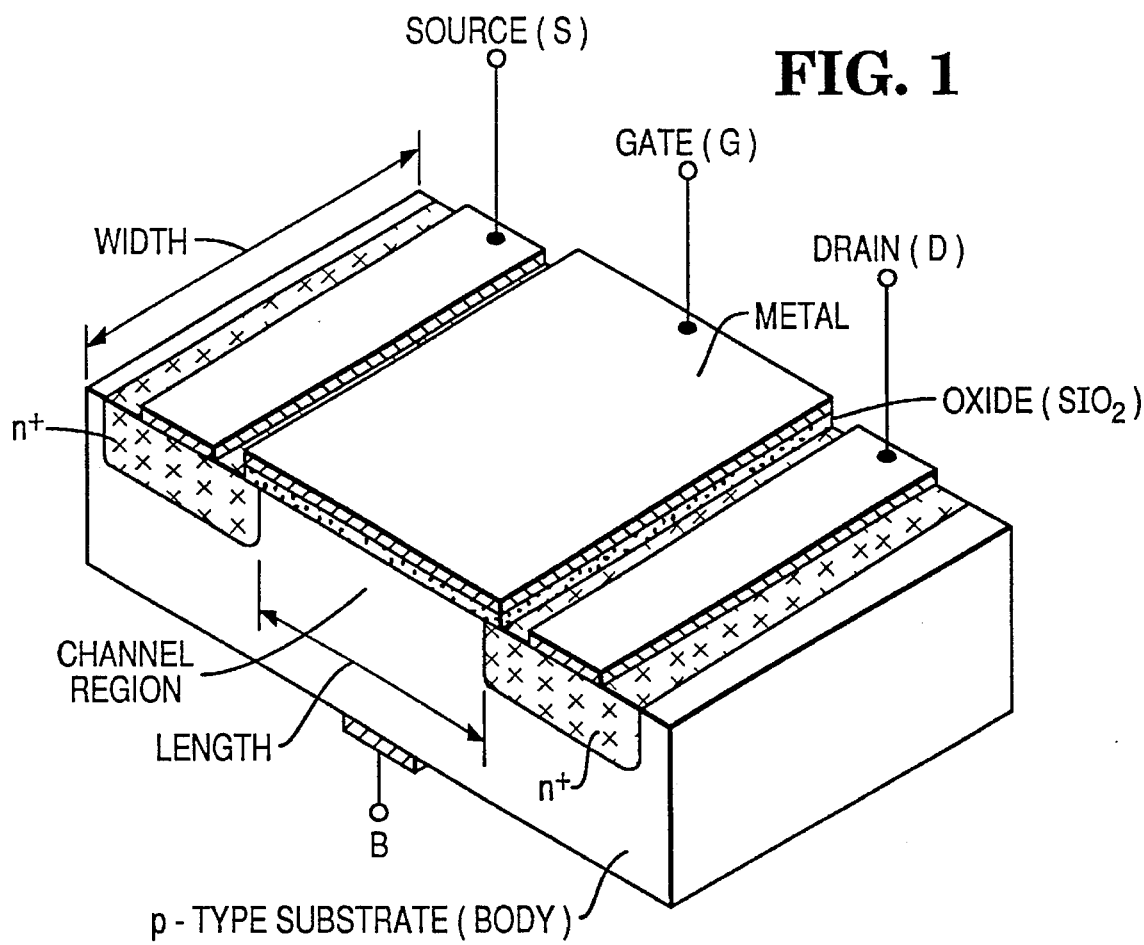
FIGS. 1 and 2 illustrate Field-Effect Transistors (FETs).
Figure 2:
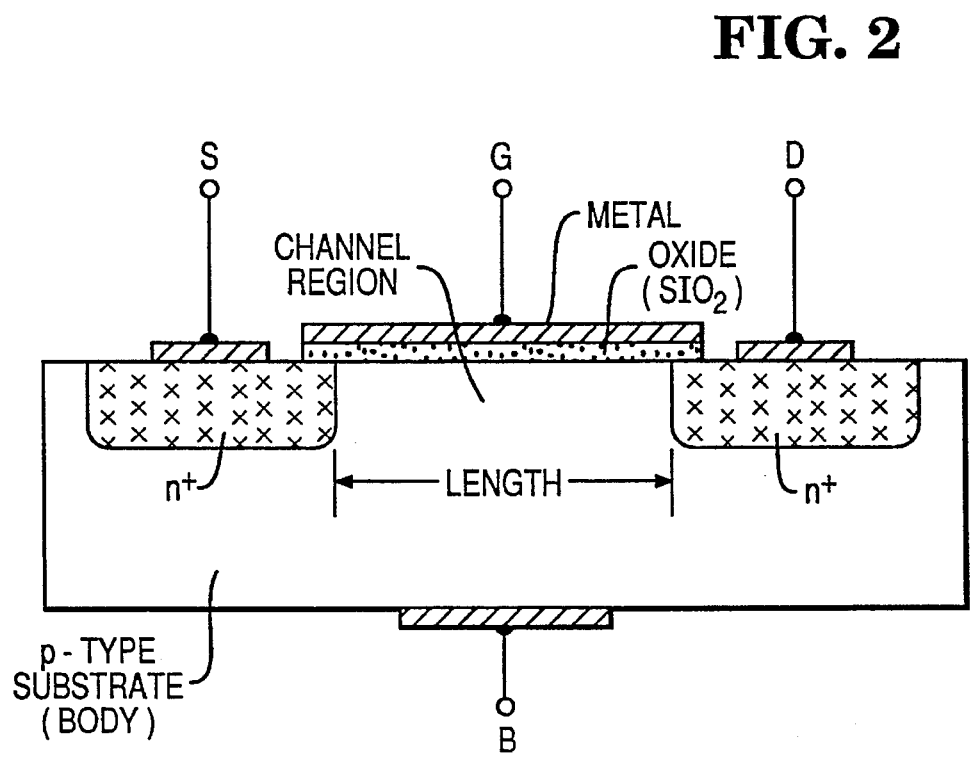
Figure 3A:
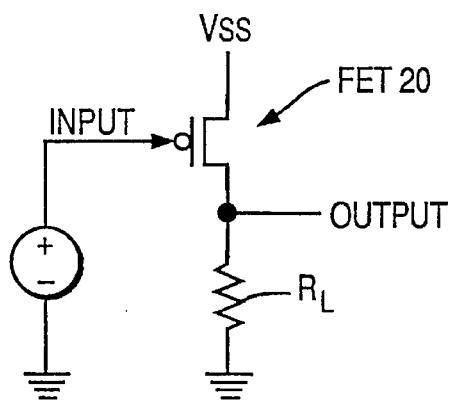
FIG. 3 illustrates a simplified FET amplifier.
Figure 3B:
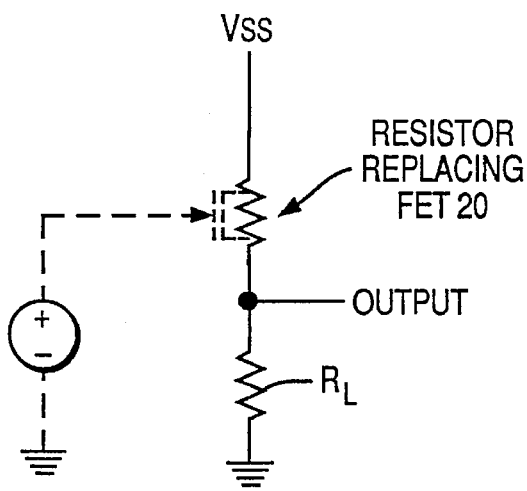

In FIG. 3A, assume that $V_{ss}$ equals 12 volts. If the INPUT is pulled HIGH, say to 12 volts, p-channel FET 90 is turned OFF. In the OFF state, this FET, in effect, becomes a large resistor R, as shown in FIG. 3B. Because R and the load resistor $R_L$ act as a voltage divider, and because R is significantly greater than $R_L$, the OUTPUT voltage is driven to nearly ZERO.

Conversely, if the INPUT is LOW, say at nine volts, R becomes a very low resistance, and the OUTPUT voltage almost reaches $V_{ss}$, or 12 volts.

For intermediate INPUT voltages between HIGH and LOW, the FET can be constructed so that the channel conductance is almost directly proportional the input voltage (when above threshold). Thus, the FET acts as an amplifier: the input voltage swing between nine and twelve volts is amplified to a swing between zero and 12 volts.

(2) Differential BET Amplifier

Figure 4:
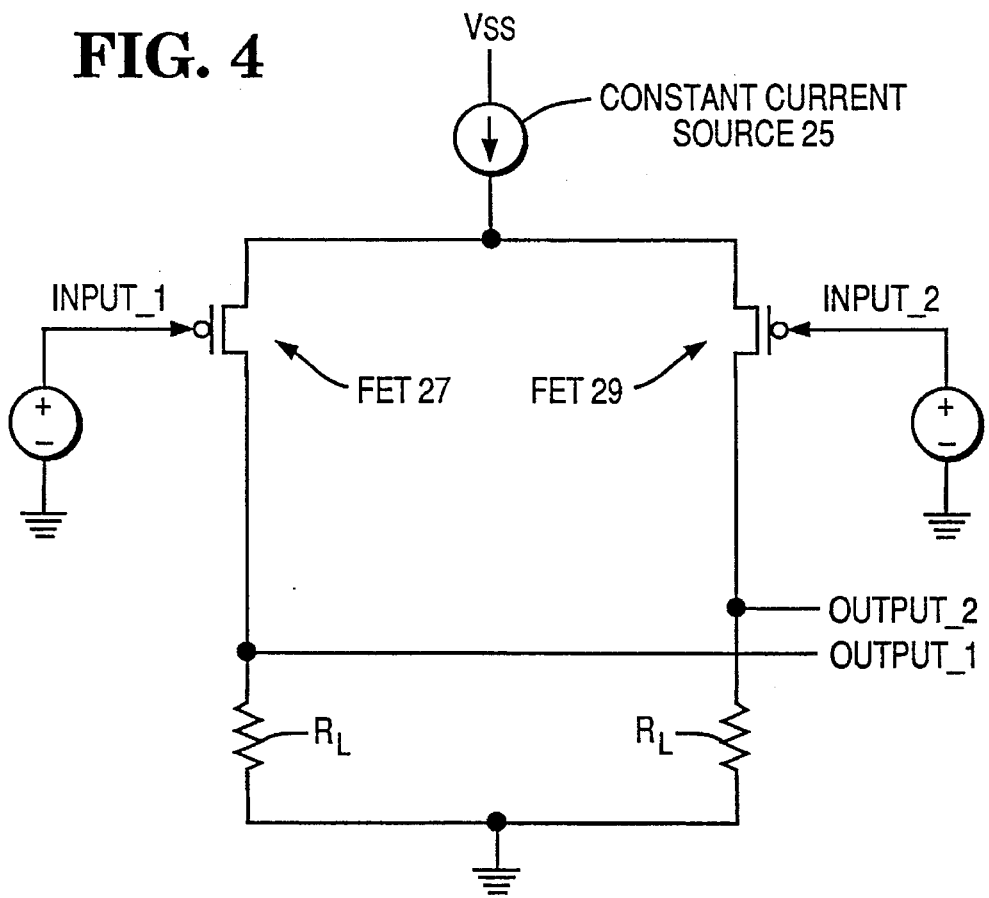
FIG. 4 illustrates how FETs can be connected into a differential amplifier.

FIG. 4 shows two of the amplifiers of FIG. 3, coupled together as a differential amplifier. They are supplied by a constant current source 25. The coupled amplifiers operate as follows:

If both INPUT 1 and INPUT 2 are HIGH, both FETs go OFF. Now, OUTPUT_A and OUTPUT_B are at equal voltages, at about ZERO volts. Because the OUTPUT voltages are equal, the difference between them is zero.

If both INPUTS are LOW, both FETs go ON, both OUTPUTs go to near 12 volts, and, again, the difference between the OUTPUT voltages is zero.

If INPUT 1 is at a higher voltage than INPUT 2 (ie, there is a difference signal present), the resistance of FET 27 will be higher than that of FET 29. Consequently, OUTPUT 2 will exceed OUTPUT 1 in voltage. Now, unlike the previous two cases, there is a difference in OUTPUT voltages.

These three situations illustrates, in simplified form, how the apparatus of FIG. 4 operates as a differential amplifier: it provides a differential OUTPUT voltage in response to a differential INPUT voltage input.

Figure 5A:
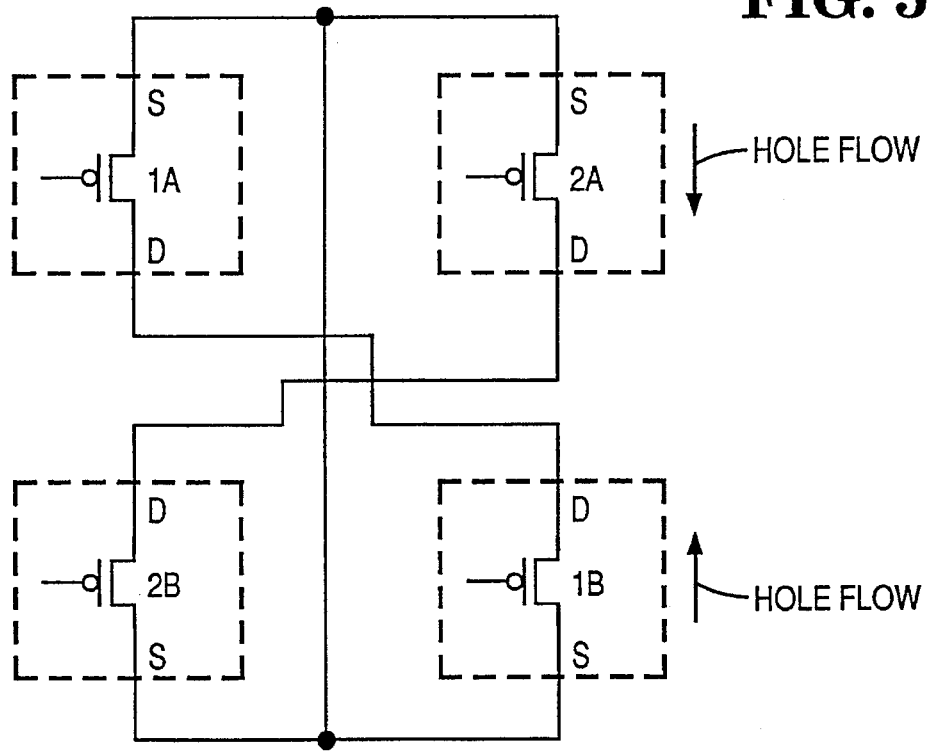
FIG. 5A illustrates the apparatus of FIG. 5B, but in simplified form.
Figure 5B:
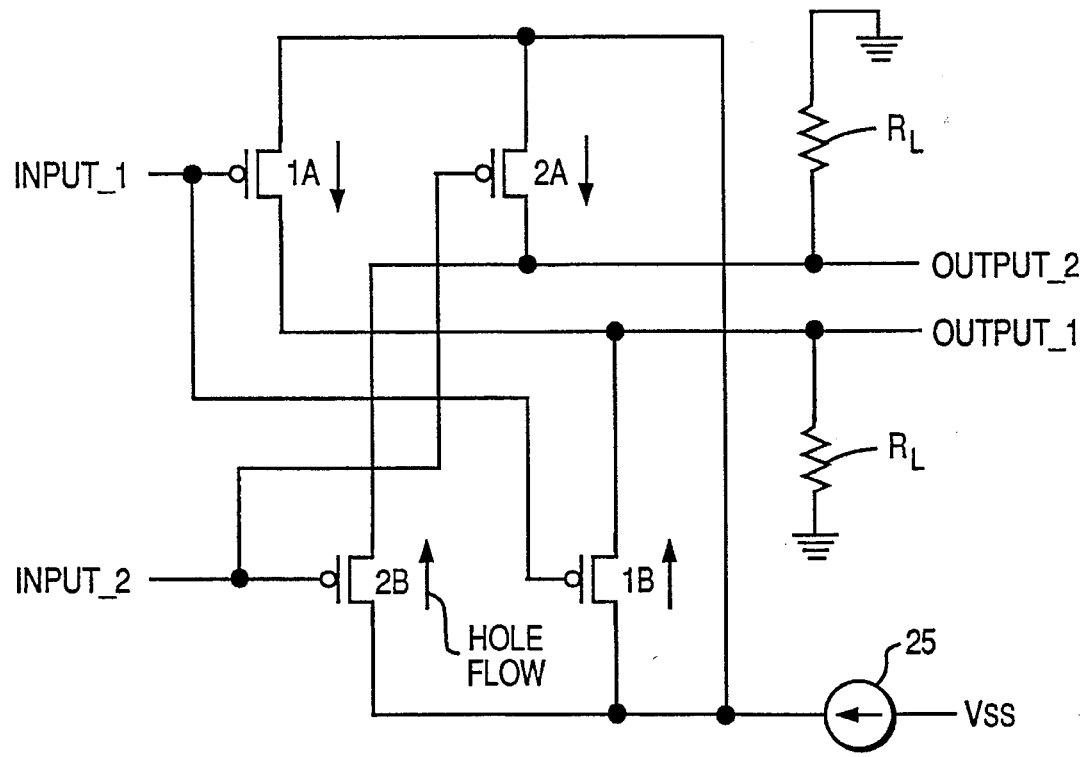
FIG. 5B illustrates how four FETs can be connected into a differential amplifier.

(3) Invention Implements a Differential Amplifier By Interconnecting Digital Transistors FIGS. 5A and 5B show one approach to connecting digital FETs together, in order to combine the individual channels of the FETs into a larger, composite, channel, which is effectively longer and wider than the individual channels. The digital transistors shown are combined into two analog transistors. For clarity, FIG. 5A omits the input and output connections shown in FIG. 5B. The connections to $V_{ss}$ and the load resistors $R_L$ are shown at the right side of FIG. 5B, and indicate how the four FETs can be connected to form a differential amplifier.

It may appear that FETs 1A and 1B (as well as FETs 2A and 2B) are connected in series, but they are not. They are both p-channel devices. Holes are the majority carrier, and the holes flow from source-to-drain, as indicated by the arrows labeled "hole flow." Consequently, transistors 1A and 1B are actually connected in parallel: their sources are connected together, as are their drains. A similar statement applies to FETs 2A and 2B.

Figure 6:
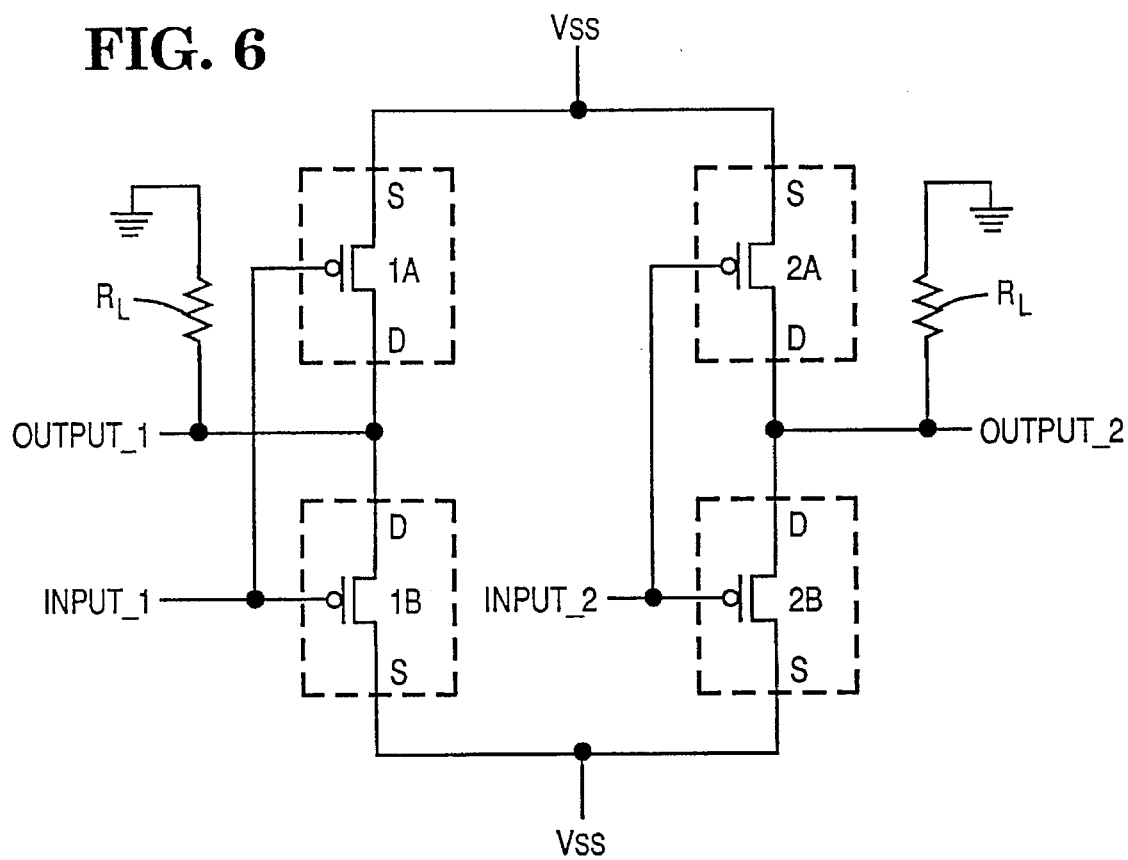
FIG. 6 illustrates the apparatus of FIG. 5A, but with the layout of the FETs rearranged, for ease of understanding.

The apparatus of FIG. 5 can, conceptually, be rearranged to that shown in FIG. 6, for ease of understanding. The members of each FET pair (1A and 1B and (2A and 2B) are connected in parallel, providing the effects of a single FET having a wider channel. However, the FETs are positioned as in FIG. 5, rather than FIG. 6, in order to compensate for diffusion gradients, as will be later discussed.

For ease of illustration, the current sources of FIG. 5B have been omitted in the subsequent Figures.

Device of FIG. 5 can be Cascaded 16-FET Cascade

Figure 7B:
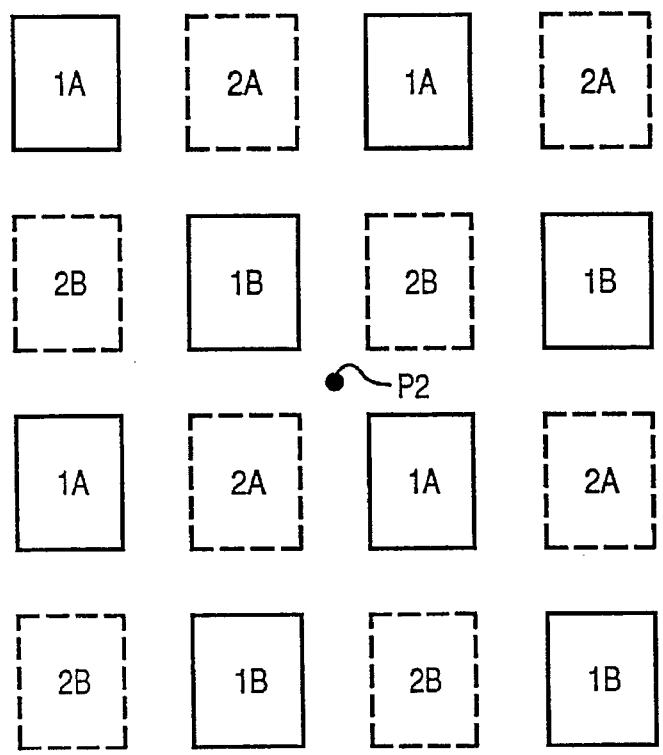
FIG. 7B illustrates two different groups of FETs in the apparatus of FIG. 7. One group is shown in solid outline; the other group is shown in phantom outline. The FETs in each group form a single compound transistor, or amplifying device.
Figure 7:
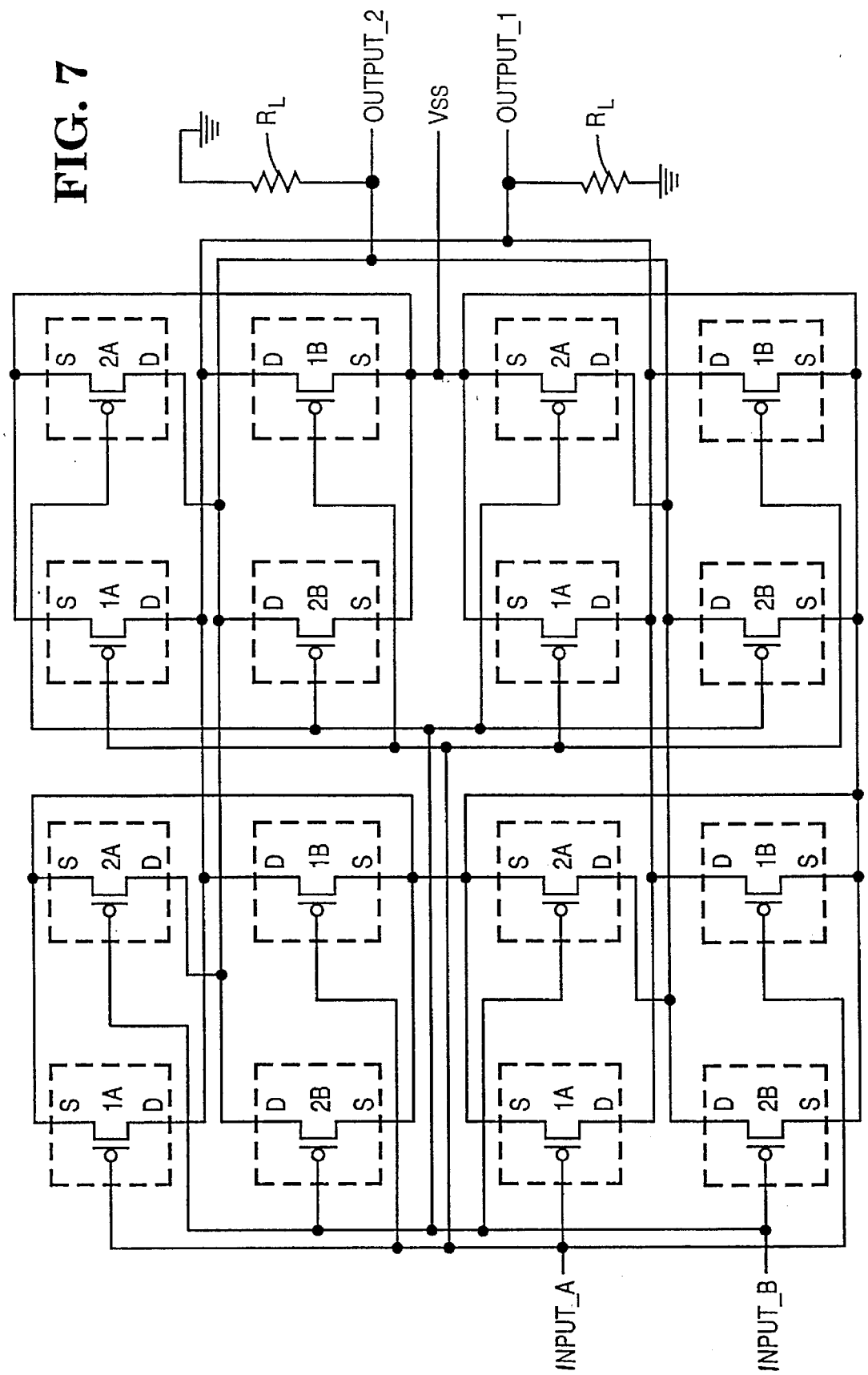
FIG. 7 illustrates how the apparatus of FIG. 5B can be cascaded into a larger differential amplifier.

The single differential amplifier of FIG. 5 can form a building block for constructing a larger amplifier. An exemplary differential amplifier containing 16 FETs will be considered. The overall connections for the 16-FET amplifier are shown in FIG. 7. Since FIG. 7 is somewhat complex, it will be considered piecewise.

Recall that FIG. 5 contains two differential transistors, namely, that formed by the pair (1A and 1B) and that formed by the pair (2A and 2B). The amplifier of FIG. 7 is similar in this respect, although, in FIG. 7, eight FETs form each differential transistor, not two FETs as in FIG. 5. One differential transistor is constructed from the eight FETs labeled 1A and 1B. The other is constructed from those labeled 2A and 2B.

Figure 8:
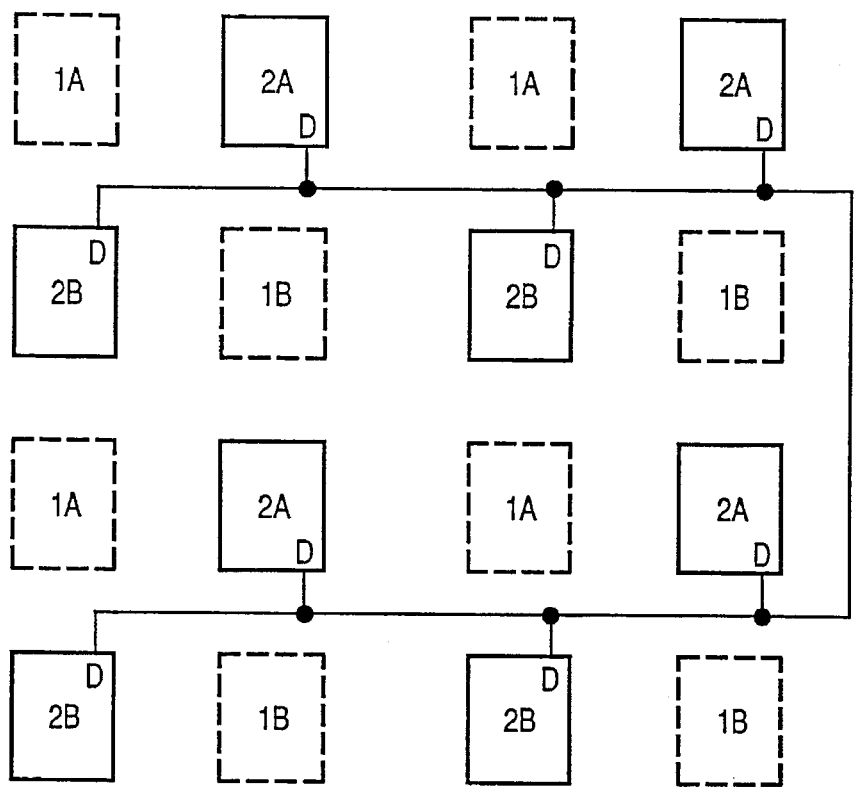
FIGS. 8–11 illustrate different aspects of the connections of FIG. 7.
Figure 8A:
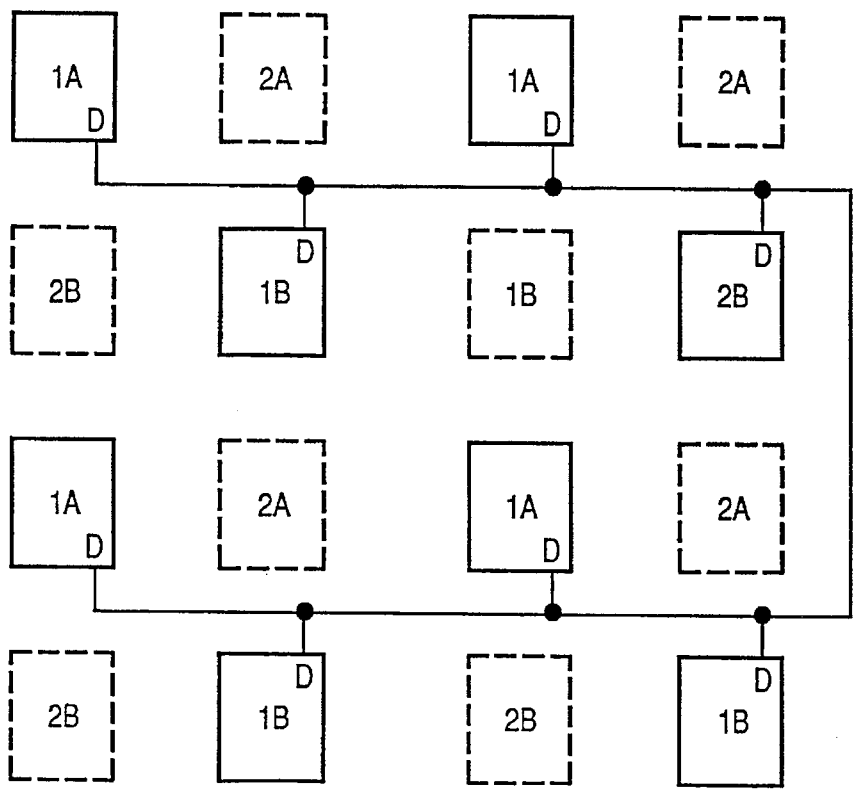

For the amplifier of FIG. 7, FIG. 8 shows how the drains of the eight FETs are connected together. FIG. 8A shows the drain connections for the other eight FETs.

Figure 9:
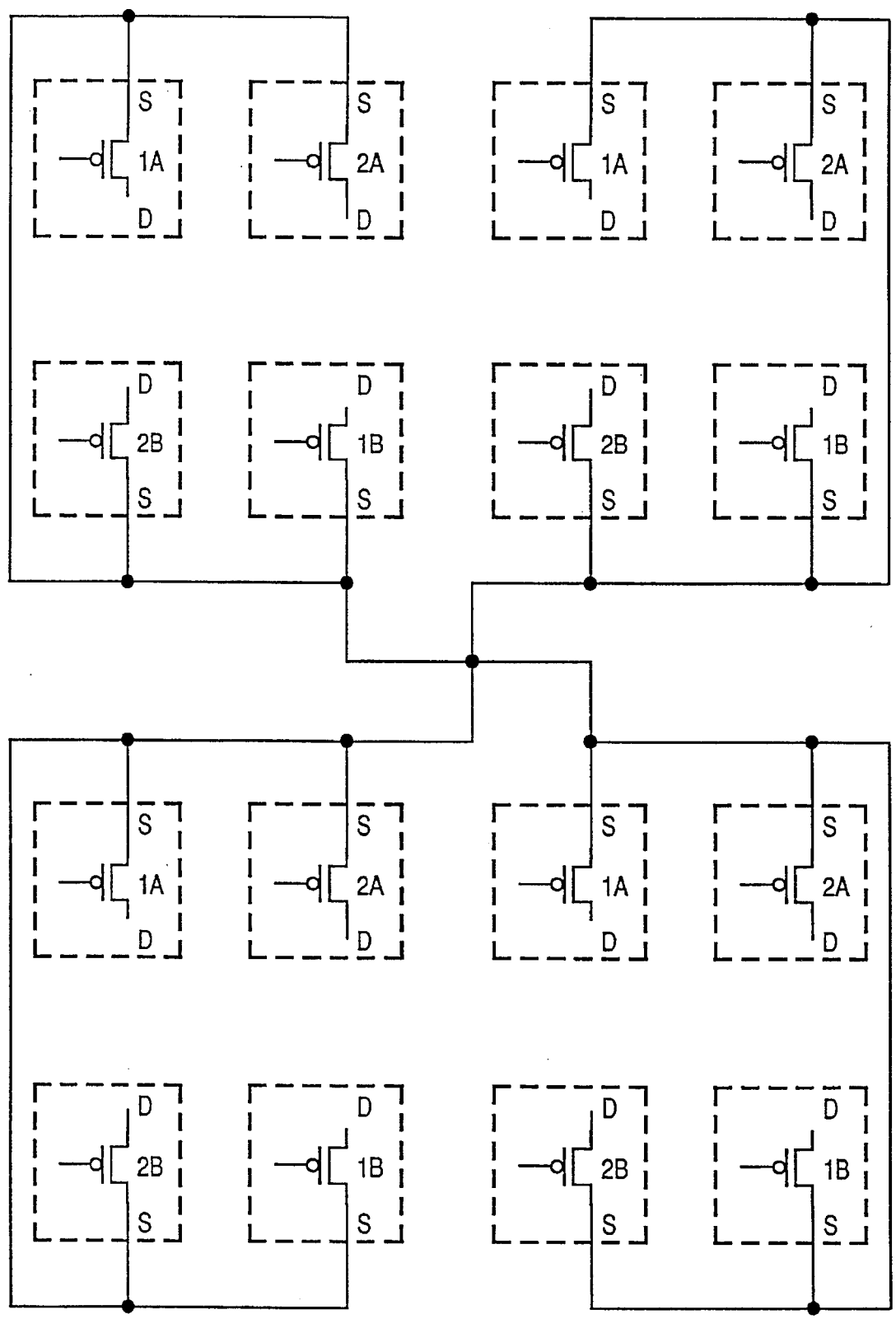

FIG. 9 shows how the sources are connected together.

Figure 10:
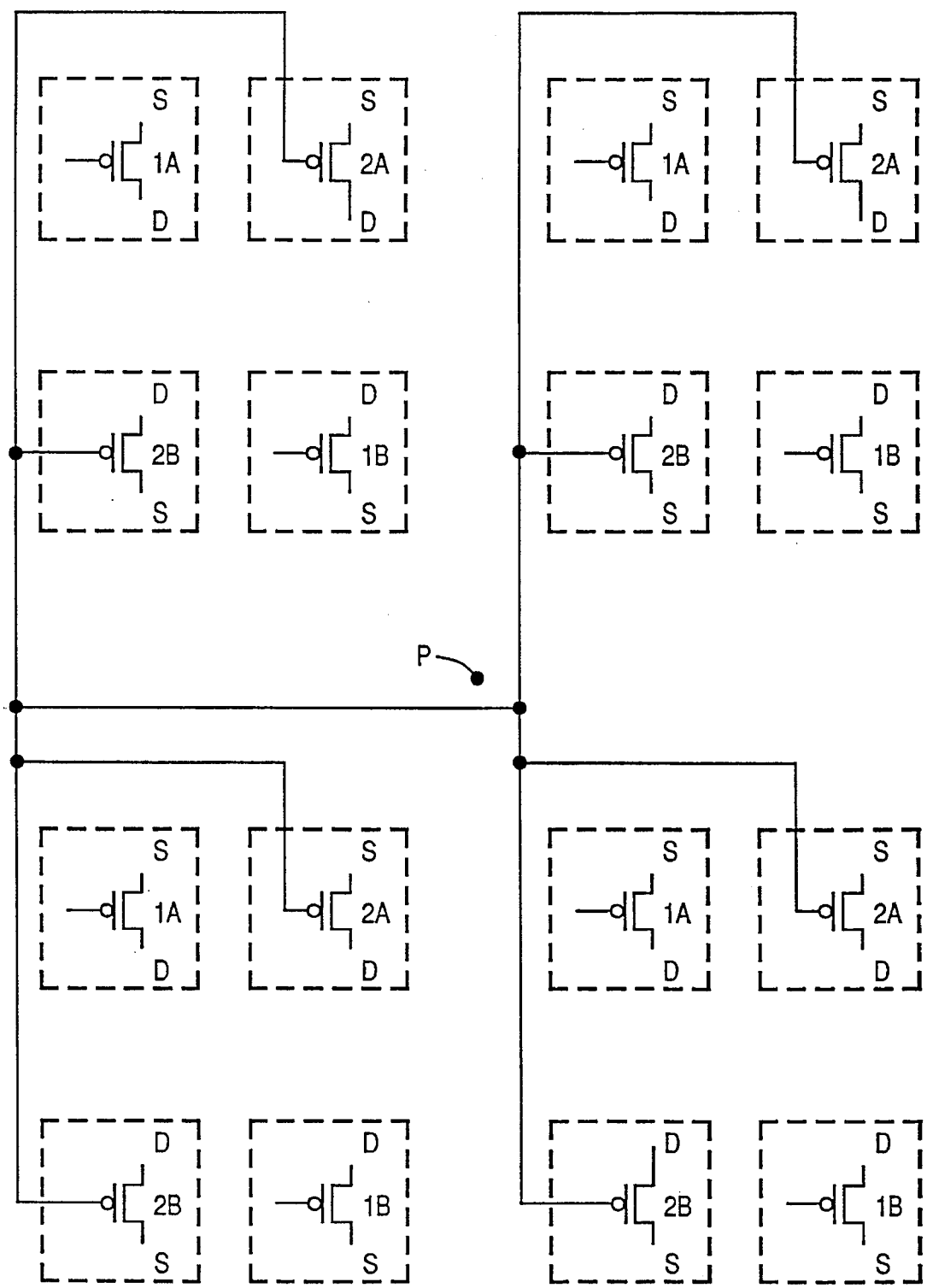

FIG. 10 shows the gate connections of the eight FETs forming one differential transistor.

Figure 11:
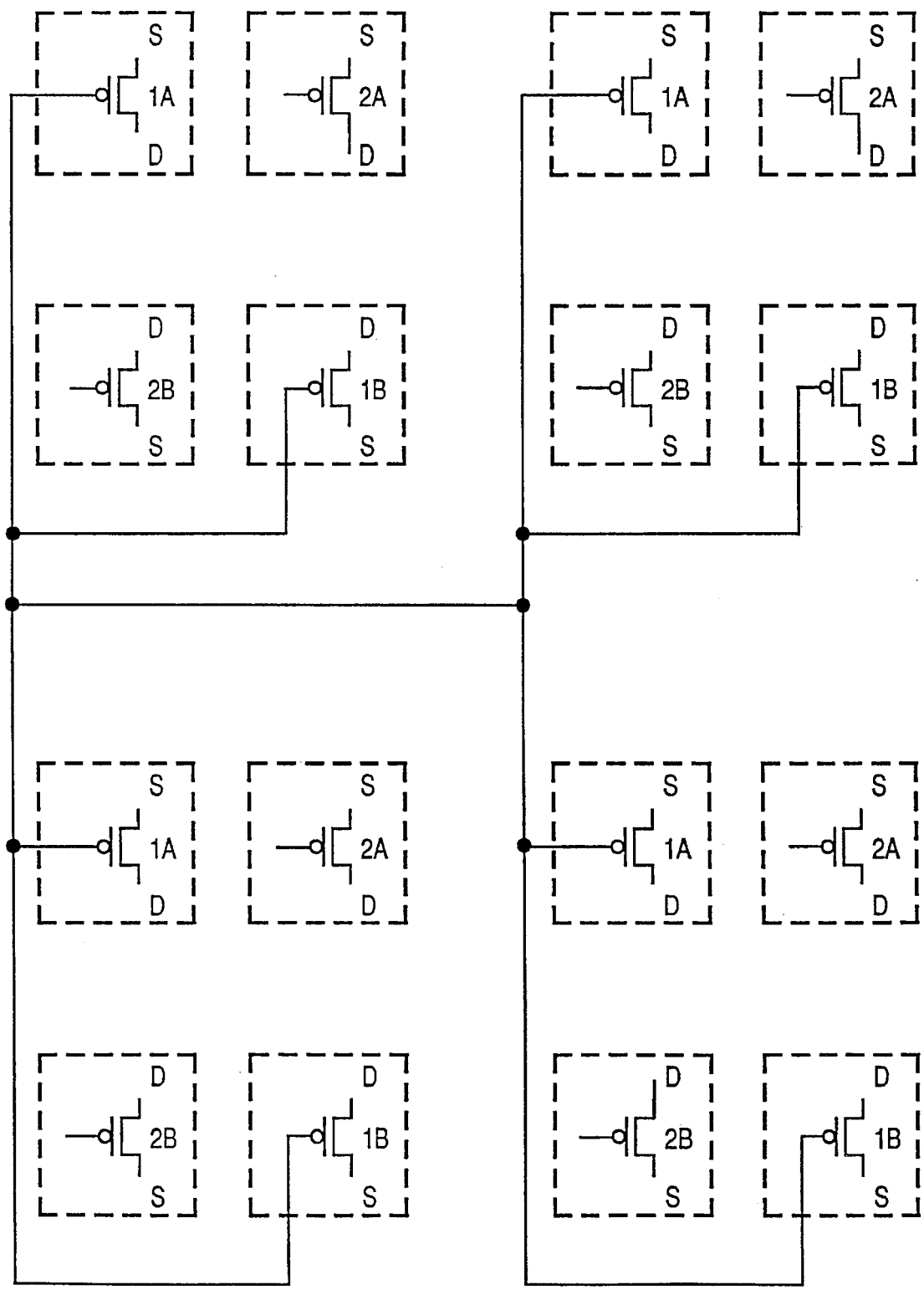

FIG. 11 shows the gate connections of the other eight FETs.

As in FIG. 5, in FIG. 7 $V_{ss}$ and two load resistors $R_L$ are connected, showing one way to use the apparatus of FIG. 7 as a differential amplifier.

Further Cascading

Figure 11A:
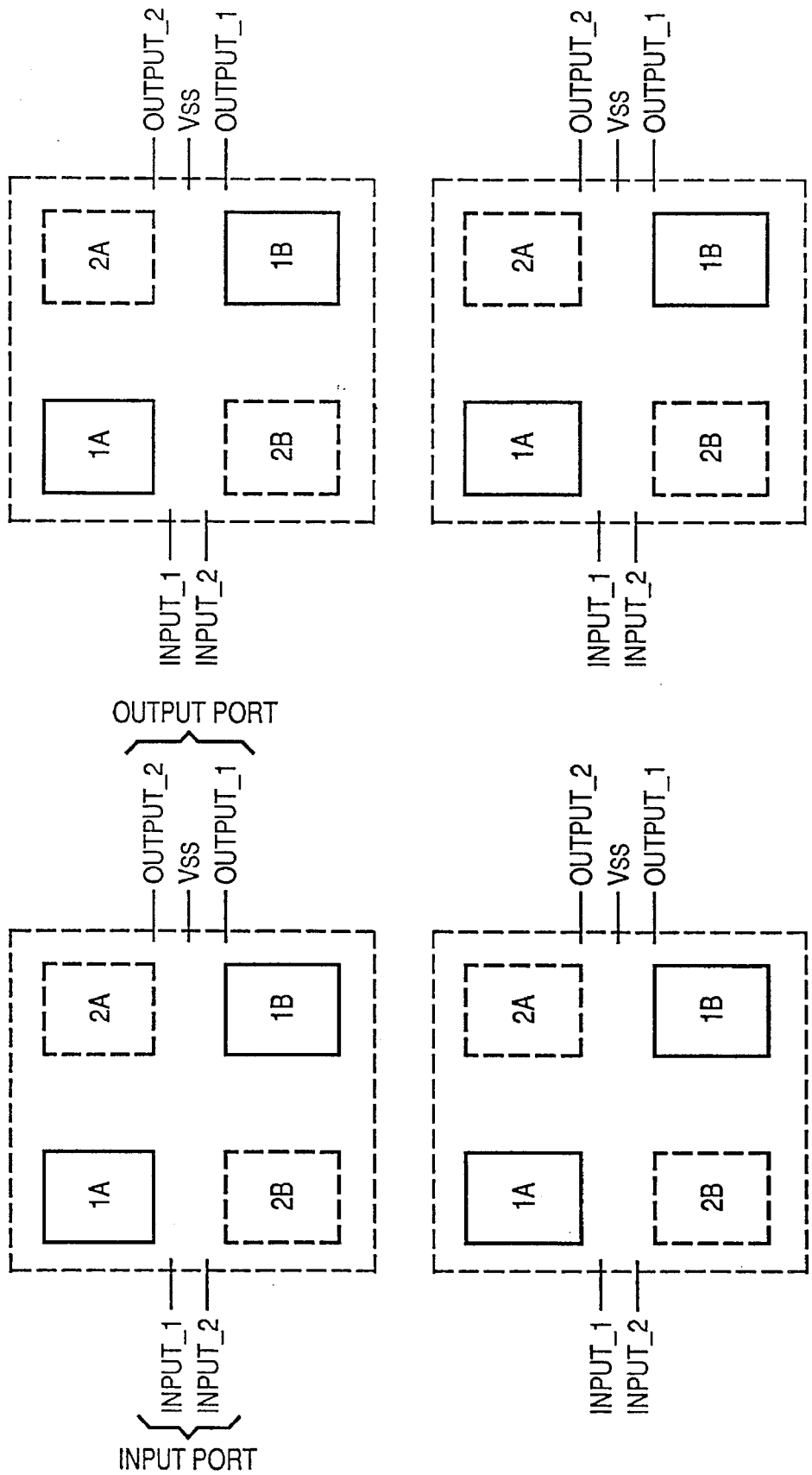
FIG. 11A illustrates how the apparatus of FIG. 5 can be treated as a building block which can be cascaded into a larger amplifier.

The 16-FET amplifier of FIG. 7 can be further cascaded into a larger amplifier. This further cascading can be explained with reference to FIG. 11A. FIG. 11A groups the 16 FETs of FIG. 7 into four groups, of four FETs each. Each group is contained within a dashed block. Each dashed block can be viewed as a two-port network, as that term is used in electrical network theory.

One port includes INPUT 1 and INPUT 2. The other port includes OUTPUT 1 and OUTPUT 2. These INPUTS and OUTPUTS are correspondingly labeled in FIG. 5B. (The lead $V_{ss}$ is, strictly speaking, not a member of a port; it is a power supply lead.)

The cascading of the two-ports is done by connecting them such that

1. All INPUT_1's are connected in common.
2. All INPUT_2's are connected in common.
3. All OUTPUT_1's are connected in common.
4. All OUTPUT_2's are connected in common.

FIG. 7 illustrates these connections for a 16-FET system.

More generally, any feasible number of two-ports can be connected in the preceding manner, into an amplifier containing an arbitrarily large number of FETs.

Additional Considerations

1. Cascade Need Not be Square

The cascaded array of FETs need not be square like the 2×2 array of FIG. 5 and the 4×4 array of FIG. 7. That is, the number of rows need not equal the number of columns. However, in all cases, the cascading is done according to the following rules:

1) The sources are connected in common.
2) Half of the gates are connected to one differential input; the other half are connected to the other differential input.
3) Half of the drains are connected to one differential output; the other half are connected to the other differential output.

2. Sources and Drains Can be Interchanged

It is recognized that FETs can be symmetrical devices, in the sense that the source can act as the drain. Consequently, the invention can be re-configured such that all S's, such as those in FIG. 5, are replaced by D's, all D's replaced by S's, $V_{ss}$ is replaced by ground, and the ground symbols are replaced by $V_{dd}$.

3. Cascading Increases Channel Size

The cascading just described, in effect, provides a composite (or compound) transistor having a wider channel than the individual FETs. For example, in FIG. 6, the channel width of each composite transistor (eg, that composed of both 1A and 1B) is effectively about double the width of each individual FET (1A or 1B).

The increased width also provides additional surface area of the channel, thus reducing 1/f noise, as described in the background of the invention.

Each individual transistor in FIG. 7 (such as 1A) can itself be constructed of several individual transistors (such as 8 to 10 transistors) connected in series. The series connection provides a composite transistor having an increased effective channel length.

4. Centroids

There is a particular layout of the FETs which is preferable. FIG. 7B shows a simplified view of the FETs of FIG. 7. In FIG. 7B, the FETs form two groups:

(1) those connecting to OUTPUT 2 (shown in dashed outline) and (2) those connecting to OUTPUT 1 (shown in solid outline).

Both groups are symmetrical about a centroid P2. The centroid can be viewed as a "center of gravity." That is, each FET can, conceptually, be viewed as a small weight. They are distributed so that the FETs in one group, by themselves with the other group absent, are balanced about the centroid P2. Restated, one could (in theory) balance the circuit on the tip of a needle located at the centroid, with either one or both groups of FETs present.

Figure 12:
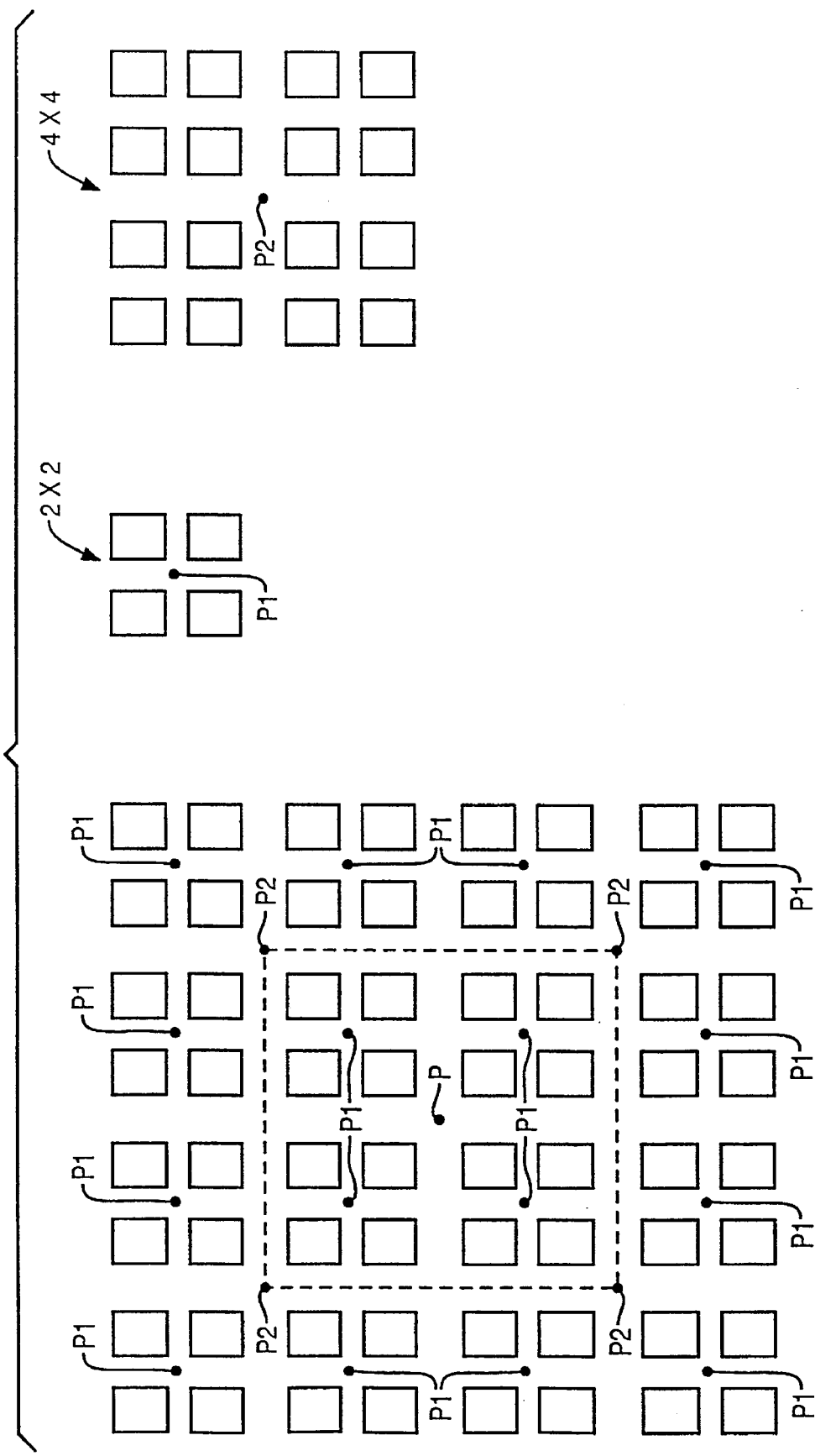
FIG. 12 illustrates how the FETs in a cascaded arrangement are arranged around centroids P, P1, and P2.

FIG. 12 shows centroids in a 16×16 array. There are three types of centroid: P, P2, and P1. Centroid P is dead-center.

Centroids P2 lie on the corners of a dashed square. Each P2 is the centroid of a 4×4 array, as indicated.

Each P1 is the centroid of a 2×2 array, as indicated.

Each 2×2 array centered about P1 can be termed a "first-order" group, with P1 termed a "first-order" centroid. FIG. 12 shows sixteen first order groups.

Each 4×4 array centered about P2 can be termed a "second-order" group, with P2 termed a "second-order" centroid. FIG. 12 shows four second order groups.

The 8×8 array centered on centroid P can be termed a "third-order group," with P termed a "third-order" centroid. FIG. 12 shows one third-order group.

In the case of a larger, 16×16 array (not shown), there would be 64 first-order groups, 16 second-order groups, 4 third-order groups, and a new designation, namely, a fourth-order group.

In principle, the cascading can be continued indefinitely.

5. Centroids are Hierarchical

It is significant that, in FIG. 12, the third-order centroid P acts as a centroid for the second-order centroids P2. That is, the centroids P2 themselves have P as a centroid. Further, the second-order centroids P2 act as centroids for the first-order centroids P1. Thus, the centroids are hierarchical: the centroid P at one order (eg, order 3) act as a centroid for the centroids P2 at the next-lower order (eg order 2), and so on.

Not only are the centroids hierarchical, but they are also cumulative. That is, the third-order centroid P is not only a centroid for the second-order centroids P2, but also for the first-order centroids P1.

6. Centroids Lie on Diagonals

Figure 13:
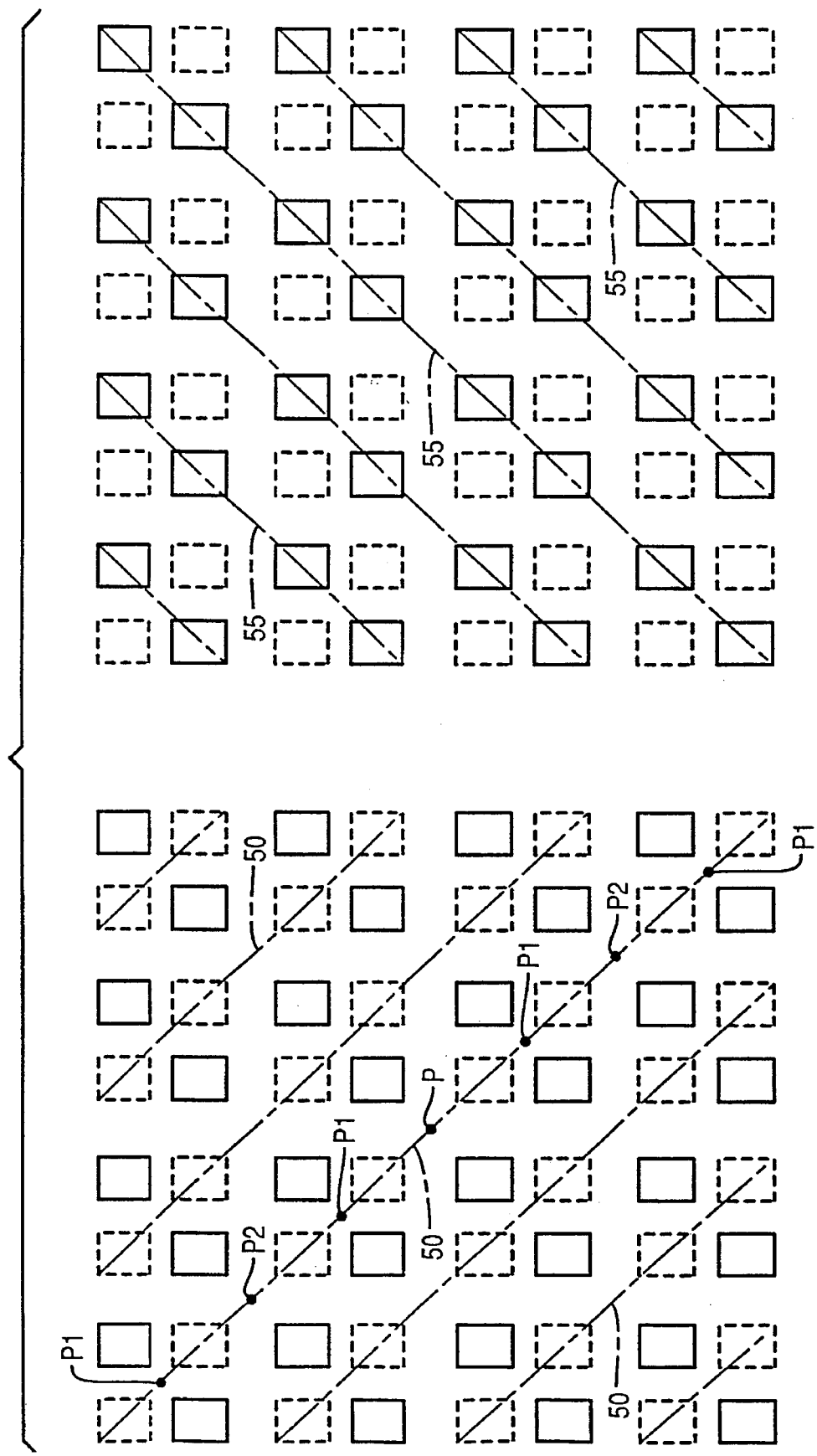
FIG. 13 illustrates how the centroids are located on diagonals.

As shown in FIG. 13, two sets of diagonals can be superimposed on the FET array. One set 50 visually connects the FETs providing one output, such as OUTPUT 1. The other set 55 visually connects the FETs providing the other output, such as OUTPUT 2.

The sets of diagonals intersect (when superimposed), and if the array is a square, the diagonals will intersect at right angles.

The diagonals intersect the centroids, as indicated (only a few centroids are shown to avoid clutter).

7. Arrangement of FIG. 7 Compensates for Diffusion Gradients

The FET array of FIG. 7 can be manufactured as an integrated circuit (IC). In IC's generally, the concentration of dopants introduced into the substrate is not constant at all points: gradients exist. One solution, known in the art, is to scatter transistors over several locations on the substrate. The invention provides better compensation than mere scattering, as will now be explained.

Second Order Gradient Explained

Figure 14A:
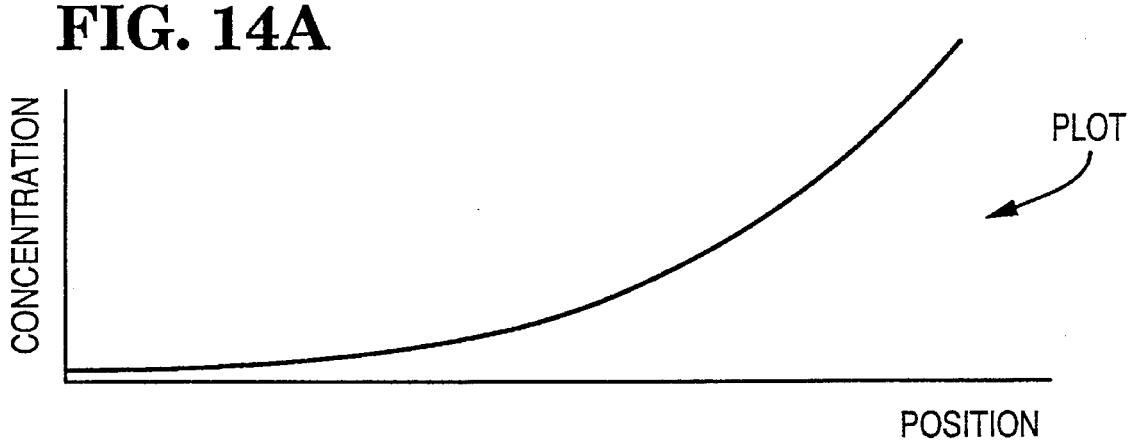
FIGS. 14A and 14B illustrate a second-order gradient in dopant concentration.
Figure 14B:
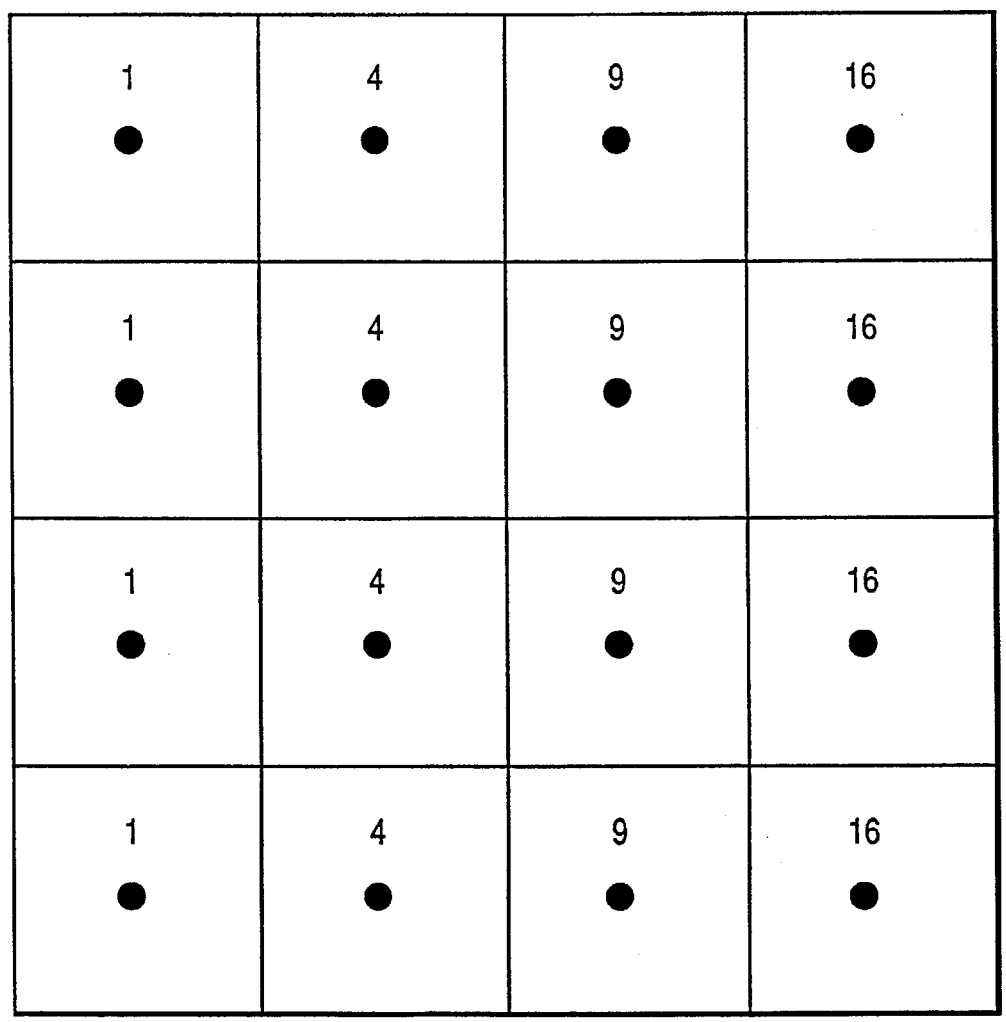

FIGS. 14A and 14B shows a second-order gradient. FIG. 14B shows 16 boxes, each representing a position on the substrate. The number in each box indicates the concentration at the center of the box. A PLOT indicates the concentration gradient. The concentration changes according to the square of position, and is thus a second-order gradient (in squaring a number, the exponent is "2," corresponding to second order).

Numerical Example

Figure 15A:
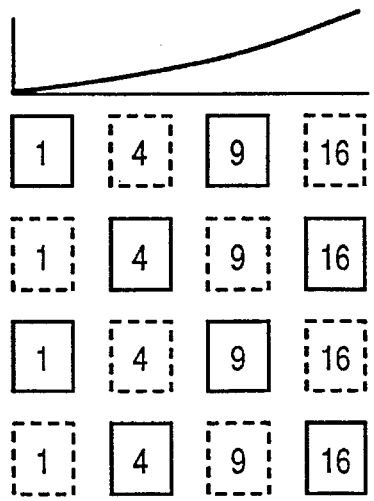
FIG. 15 illustrates four different orientations of the FET array with respect to a substrate having a second-order diffusion gradient.

FIG. 15A shows the cells of FIG. 14B, but with one-half of the cells drawn in phantom. The phantom cells correspond to FETs 2A or 2B in FIG. 7B. The solid cells correspond to FETs 1A or 1B.

The average concentration for the phantom cells is $$(4+16+1+9+4+16+1+9)/8=60/8=7.5.$$

For the solid cells, the average concentration is the same.

Thus, with this configuration, the average dopant concentration in the channel of one of the differential transistors is 7.5.

Figure 15B:
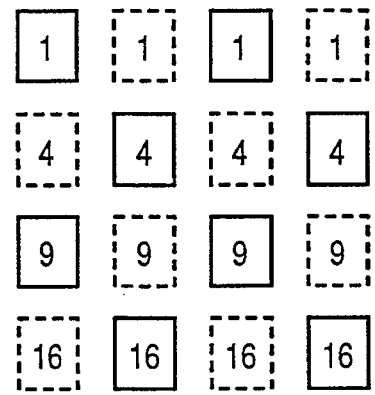
Figure 15B:
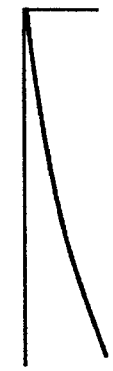
Figure 15C:
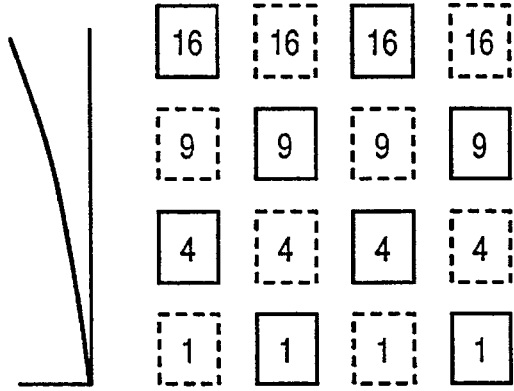
Figure 15D:
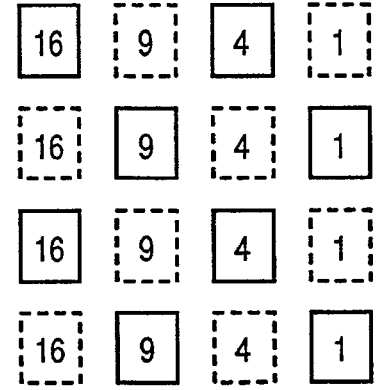
Figure 15D:
Figure 16:
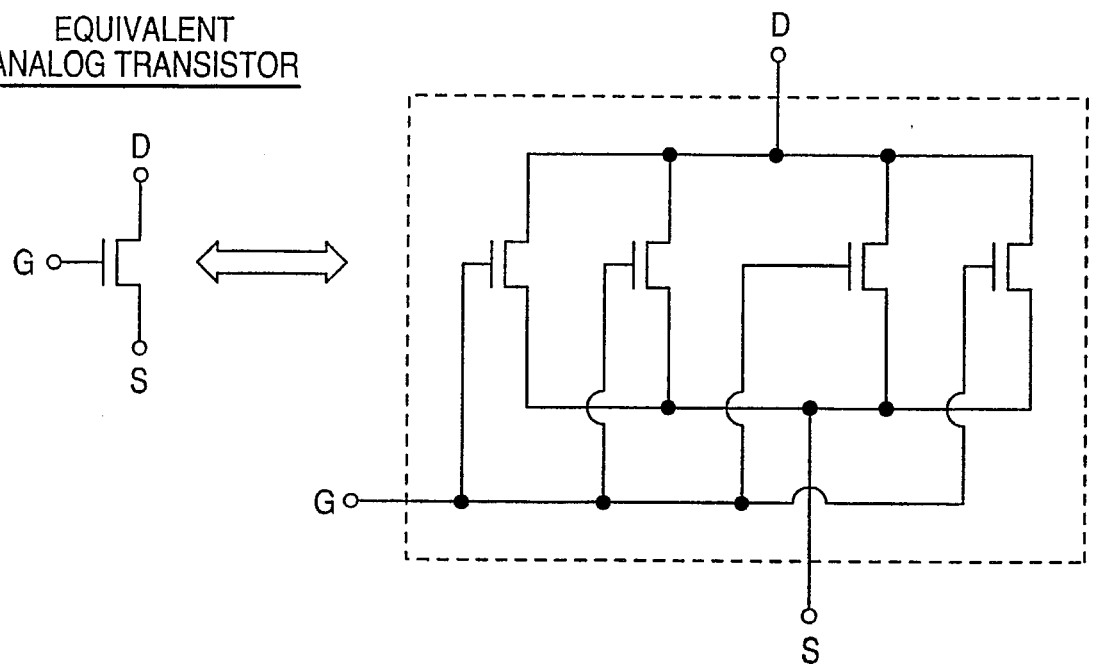
FIG. 16 illustrates an equivalent analog transistor formed with 4 FETs connected in parallel.
Figure 17:
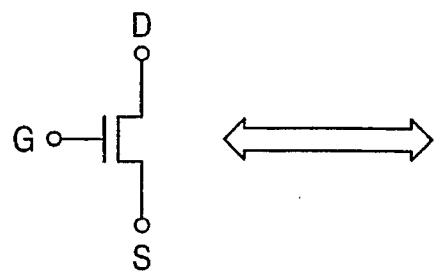
FIG. 17 illustrates an equivalent analog transistor formed with 4 FETs connected in series.
Figure 17:
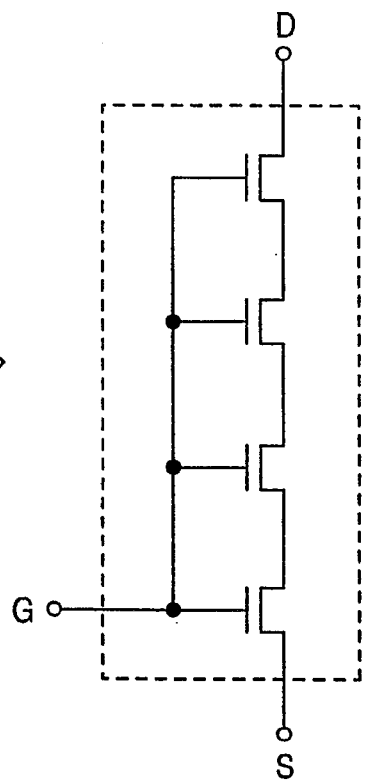

In addition, this average concentration does not change if the cells are re-oriented with respect to the concentration gradient. FIGS. 15B–15D illustrate this lack of change.

Invention's Average Concentration Is Better than Random Distribution of FETs (Given Second-Order Gradient)

It can be shown that these average concentrations in the differential transistors are closer (in FIG. 15 they are identical) than if the two differential transistors were constructed from transistors selected at random in FIG. 15.

8. Definition

Phantom Squares can be Viewed as Located in "Odd" Positions In Array; Solid in "Even" Positions.

In FIG. 15, a given square (and thus the FET located in that square) can be identified by its (row, column) address. For example, the "1" square is located in (row 1, column 1); a "16" square is located in (row 3, column 4); another "16" square is located in (row 4, column 4).

These locations are either "odd" or "even," based on the sum of (row-plus-column). For example, the "1" square is at an even location: 1+1=2, and 2 is an even number.

9. One View of Invention

The invention:

provides an array of FETs;

divides the array into two groups of FETs (such as the phantom and solid cells in FIG. 15);

connects the FETs of each group into a composite differential transistor (or amplifier); and as a result, the composite transistors become comparable in average channel concentration, irrespective of the orientation of the array with respect to the gradient FIG. 15.

Numerous substitutions and modifications can be undertaken without departing from the true spirit and scope of the invention. What is desired to be secured by Letters Patent is the Invention as defined in the following claims.

I claim:

1. An electronic integrated circuit, comprising:

a differential amplifier, including at least four Field-Effect Transistors (FETs) of digital type, at least two of the FETs (i) having their respective channels interconnected by connecting a drain of one FET to a source of another FET, (ii) and having their respective gates interconnected, to form at least one composite channel having a longer channel than the individual FETs.

2. The electronic integrated circuit of claim 1 further having the respective channels interconnected to form that at least one composite channel having a wider channel than the individual FETs.

3. An electronic integrated circuit, comprising:

a differential amplifier, including at least four Field-Effect Transistors (FETs) of digital type, having at least two of their respective channels interconnected by connecting a drain of one FET to a source of another FET, to form at least one composite channel having a longer channel than the individual FETs, in which the FETs of the digital type form a plurality of arrays, each array having a respective centroid, and all respective centroids having a common centroid.

4. An electronic integrated circuit, comprising:

a differential amplifier comprising at least four groups of transistors, each group having at least two Field-Effect Transistors (FETs) having channel lengths less than about 1.5 microns, wherein the FETs in each respective group have their channels serially interconnected to form a composite channel having a longer channel than the individual FETs, whereby the composite channel is characterized by either blocking current flow, or allowing current flow, in a consistent manner through each individual FET channel, wherein the FETs in each respective group have their gates commonly connected together.

5. An electronic integrated circuit, comprising:

a differential amplifier comprising at least four groups of transistors, each group having at least two Field-Effect Transistors (FETs) having channel lengths less than about 1.5 microns, wherein the FETs in each respective group have their channels serially interconnected to form a composite channel having a longer channel than the individual FETs, wherein at least two of the groups are connected in parallel to form the at least one composite channel having a wider channel than the individual FETs, and wherein the FETs in each respective group have their gates commonly connected together.

6. An electronic integrated circuit, comprising:

a differential amplifier comprising at least two groups of transistors, each group having at least two Field-Effect Transistors (FETs) having channel lengths less than about 1.5 microns, wherein the FETs in each respective group have their channels serially interconnected to form a composite channel having a longer channel than the individual FETs, whereby the composite channel is characterized by either blocking current flow, or allowing current flow, in a consistent manner through each individual FET channel, wherein the FETs in each respective group have their gates commonly connected together.

* * * * *